United States Patent
Asayama et al.

(10) Patent No.: US 9,607,971 B2
(45) Date of Patent: Mar. 28, 2017

(54) SEMICONDUCTOR DEVICE AND SENSING SYSTEM

(71) Applicant: Sony Corporation, Tokyo (JP)

(72) Inventors: Go Asayama, Kanagawa (JP); Anup Sharma, Cupertino, CA (US)

(73) Assignee: Sony Corporation, Tokyo (JP)

( * ) Notice: Subject to any disclaimer, the term of this patent is extended or adjusted under 35 U.S.C. 154(b) by 583 days.

(21) Appl. No.: 13/901,953

(22) Filed: May 24, 2013

(65) Prior Publication Data

US 2013/0320197 A1    Dec. 5, 2013

Related U.S. Application Data

(60) Provisional application No. 61/655,237, filed on Jun. 4, 2012.

(51) Int. Cl.
| | | |
|---|---|---|
| *H01L 27/14* | (2006.01) | |
| *H01L 25/16* | (2006.01) | |
| *H01L 27/146* | (2006.01) | |
| *H04N 5/378* | (2011.01) | |

(52) U.S. Cl.
CPC ........ *H01L 25/167* (2013.01); *H01L 27/1465* (2013.01); *H01L 27/14609* (2013.01); *H04N 5/378* (2013.01); *H01L 2924/0002* (2013.01)

(58) Field of Classification Search
CPC ............. H01L 25/167; H01L 27/14609; H01L 27/1465; H01L 25/162; H01L 27/14634; H01L 27/14661; H01L 27/1467; H01L 27/1469; H01L 27/14881; H04N 5/378

USPC .......... 250/208.1, 214.1; 257/290–292, 226, 257/686, 724; 348/294–311
See application file for complete search history.

(56) References Cited

U.S. PATENT DOCUMENTS

| | | | | |
|---|---|---|---|---|
| 6,452,213 B1 * | 9/2002 | Kimura | ............... | H01L 27/1296 |
| | | | | 257/66 |
| 7,071,531 B2 * | 7/2006 | Rhodes | ............. | H01L 21/76237 |
| | | | | 257/292 |
| 7,170,049 B2 * | 1/2007 | Iwanczyk | ............. | G01T 1/2928 |
| | | | | 250/208.1 |

(Continued)

FOREIGN PATENT DOCUMENTS

| | | |
|---|---|---|
| DE | 197 32 755 A1 | 2/1998 |
| JP | 2001-251610 A | 9/2001 |

(Continued)

OTHER PUBLICATIONS

International Search Authority—PCT Invitation to Pay Additional Fees, and Where Application, Protest Fees (PCT Article 17(3)(a) and Rule 40.1 and 40.2(e)) issued Oct. 15, 2013 for corresponding International Application No. PCT/JP2013/003440.

(Continued)

*Primary Examiner* — Tony Ko
(74) *Attorney, Agent, or Firm* — Michael Best & Friedrich LLP

(57) ABSTRACT

A semiconductor device includes a first substrate that has a sensing portion that detects predetermined information, a second substrate that has a first processing portion that processes data supplied thereto from the sensing portion, and a third substrate having a second processing portion that processes data supplied thereto either from the first substrate or from the second substrate.

12 Claims, 16 Drawing Sheets

(56) References Cited

U.S. PATENT DOCUMENTS

| | | | |
|---|---|---|---|
| 8,817,139 B2* | 8/2014 | Yanada | H04N 9/07 348/266 |
| 8,946,610 B2* | 2/2015 | Iwabuchi | H01L 27/1464 250/208.1 |
| 2002/0094661 A1* | 7/2002 | Enquist | H01L 21/2007 438/455 |
| 2005/0180122 A1* | 8/2005 | Okabe | H01L 23/66 361/803 |
| 2007/0153483 A1* | 7/2007 | Refai-Ahmed | H01L 23/367 361/704 |
| 2008/0042046 A1* | 2/2008 | Mabuchi | 250/208.1 |
| 2008/0084667 A1* | 4/2008 | Campbell | H05K 7/20772 361/702 |
| 2008/0084668 A1* | 4/2008 | Campbell | H01L 23/473 361/702 |
| 2009/0001612 A1 | 1/2009 | Song et al. | |
| 2012/0293698 A1 | 11/2012 | Sukegawa et al. | |
| 2013/0068929 A1* | 3/2013 | Solhusvik | H01L 27/14634 250/208.1 |
| 2013/0127070 A1 | 5/2013 | Jung et al. | |

FOREIGN PATENT DOCUMENTS

| | | |
|---|---|---|
| JP | 2008-193359 A | 8/2008 |
| JP | 2009-005262 A | 1/2009 |
| JP | 2009-134828 A | 6/2009 |
| JP | 2010-283787 A | 12/2010 |
| RU | 2 190 251 C2 | 9/2002 |
| WO | WO-2006/129762 A1 | 12/2006 |
| WO | WO-2011/142581 A2 | 11/2011 |

OTHER PUBLICATIONS

Atmel: "ATmega 8(L) Preliminary Summary", Published Dec. 31, 2002, XP002713043, Retrieved from the Internet: URL:www.promelec.ru/pdf/atmega8.pdf [Retrieved Sep. 17, 2013].

European Action Article 94.(3) EPC issued on Sep. 25, 2015 for corresponding European Application No. 13728539.1.

Japanese Office Action issued Jan. 31, 2017 for corresponding Japanese Office Application 2014-552415.

* cited by examiner

F I G . 9
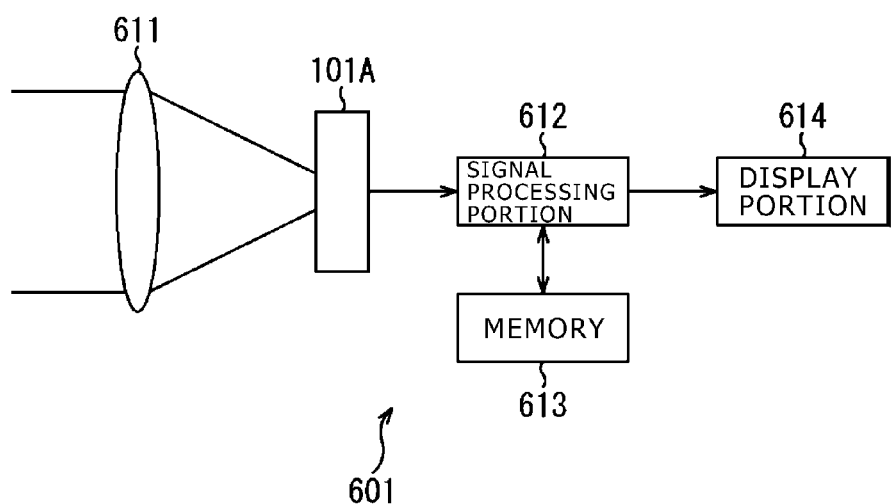

SEMICONDUCTOR DEVICE AND SENSING SYSTEM

CROSS-REFERENCE TO RELATED APPLICATION

This application claims the benefit of priority of Provisional Application Ser. No. 61/655,237, filed Jun. 4, 2012, the entire contents of that are incorporated herein by reference.

BACKGROUND

The present disclosure relates to a semiconductor device and a sensing system including the semiconductor, and more particularly to a semiconductor device in which a high-quality signal can be obtained, and a sensing system including the semiconductor.

In proposing the technique of the present disclosure, a difference between the existing semiconductor device and sensing system, and a semiconductor device and a sensing system of the present disclosure will be described below. In the following, a description will be given by exemplifying an image processing sensing system.

FIG. 1 is a block diagram showing an example of a configuration of an existing image sensor 1. In the existing image sensor 1, a reference voltage generating portion 19 supplies a necessary reference voltage to each of individual portions. A driver 17 drives a pixel portion 11 in which plural pixels are disposed in a matrix, thereby reading out an analog video signal from the pixel portion 11. An Analog to Digital (AD) converter 12 compares the analog video signal inputted thereto from the pixel portion 11 with a reference voltage that is supplied from a Digital to Analog (DA) converter 18 so as to be gradually increased, and inverses an output signal thereof when a level of the analog video signal has reached the reference voltage.

A counter 13 counts a clock for a period of time until the output signal from the AD converter 12 is inverted from a predetermined timing on. As a result, the level of the analog video signal is converted into a digital video signal. A Static Random Access Memory (SRAM) 14 temporarily stores therein the digital video signal output from the counter 13.

A pipeline processing portion 15 subjects the digital video signal supplied thereto from the SRAM 14 to various kinds of processing. The pipeline processing portion 15 builds therein an SRAM 15A and the SRAM 15A temporarily stores therein the digital video signal that has been subjected to preprocessing. The digital video signal read out from the SRAM 15A is output to the outside through a data interface 16.

A Micro Processing Unit (MPU) 20 controls operations of the individual portions in accordance with a program and data stored in a One Time Programmable Read Only Memory (OTP) 21.

Heretofore, an image sensor has been known in which the pixel portion 11 described above and other circuit 31 are disposed on one sheet of substrate. In a word, the AD converter 12, the counter 13, the SRAM 14, the pipeline processing portion 15, the data interface 16, the driver 17, the DA converter 18, the reference voltage generating portion 19, the MPU 20, and the OTP 21 are disposed in the circuit portion 31.

For the purpose of balancing integration and noise characteristics, this applicant for letters patent previously proposes a technique, for example, described in Japanese Patent Laid-Open No. 2011-159958.

However, in the case of a structure in which the substrate of the pixel portion 11, and the substrate of the circuit portion 31 are laminated on top of each other in such a manner, the heat generated in the circuit portion 31 exerts a bad influence on the pixel portion 11, thereby deteriorating the video signal in some cases. As a result, it is necessary to provide a circuit for compensating for such a situation, which leads to an increase in cost in some cases. If the circuit for the compensation is omitted, then it becomes difficult to provide the high-quality image sensor.

SUMMARY

The present disclosure has been made in order to solve the problems described above, and it is therefore desirable to enable a high-quality signal to be obtained.

It is also desirable to suppress deterioration of a signal due to a noise and heat.

It is further desirable to enable various kinds of semiconductor devices to be manufactured in an optimal manufacturing process.

It is still further desirable to enable power consumption to be suppressed.

It is yet further desirable to enable various kinds of signal forms to be embodied.

It is even further desirable to enable detected information to be partially output.

It is further desirable to enable an interface speed for input/output to be relaxed.

It is still further desirable to enable radiation of an electromagnetic wave to be suppressed.

It is yet further desirable to enable a signal with which various kinds of pieces of physical information are detected to be output after the signal is subjected to signal processing.

It is even further desirable to enable the standards for signals having various forms within a substrate to be standardized.

In order to attain the desires described above, according to an embodiment of the present disclosure, there is provided a semiconductor device including: a first substrate having a sensing portion detecting predetermined information; a second substrate having a first processing portion processing data supplied thereto from the sensing portion; and a third substrate having a second processing portion processing data supplied thereto either from the first substrate or from the second substrate.

According to another embodiment of the present disclosure, there is provided a sensing system including: a sensing device detecting predetermined information, the sensing device including a first substrate having a sensing portion detecting predetermined information, a second substrate having a first processing portion processing data supplied thereto from the sensing portion, and a third substrate having a second processing portion processing data supplied thereto either from the first substrate or from the second substrate.

BRIEF DESCRIPTION OF DRAWINGS

FIG. 9 is a block diagram showing a configuration of a sensing system according to a second embodiment of the present disclosure;

DETAILED DESCRIPTION OF THE PREFERRED EMBODIMENTS

Embodiments of the present disclosure will be described in detail hereinafter with reference to the accompanying drawings.

Figure 1:
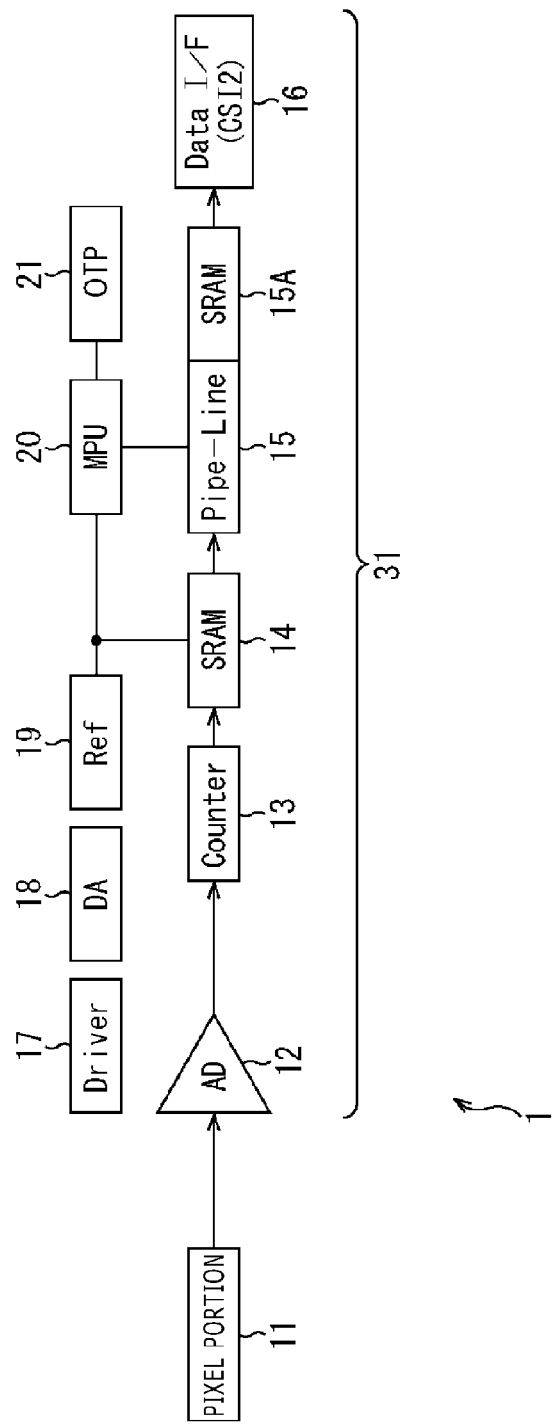
FIG. 1 is a block diagram showing an example of a configuration of an existing image sensor.
Figure 2:
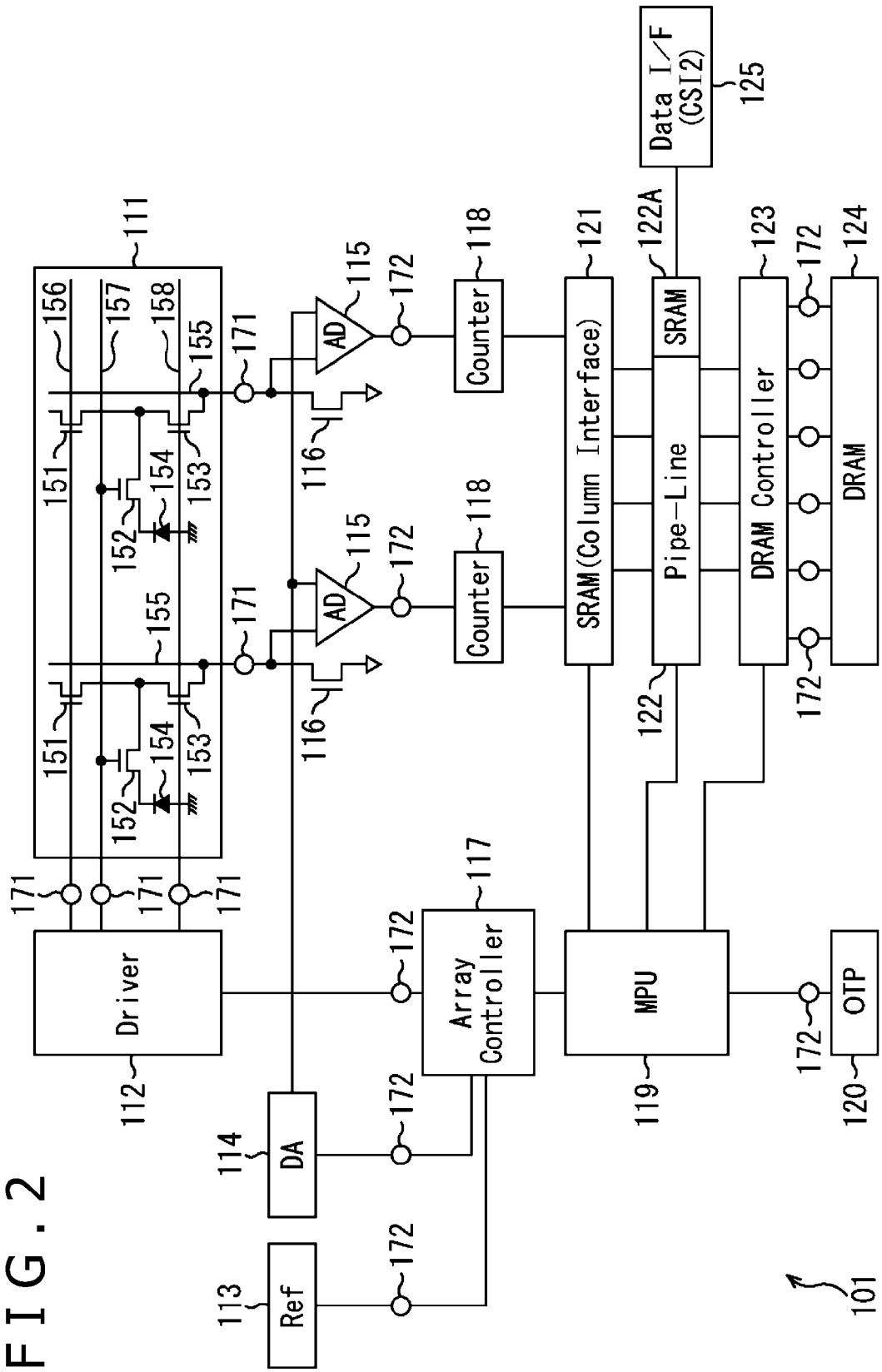
FIG. 2 is a block diagram, partly in circuit, showing a semiconductor device according to a first embodiment of the present disclosure.

FIG. 2 is a block diagram, partly in circuit, showing a semiconductor device according to a first embodiment of the present disclosure. A semiconductor device 101 that can be used as a Complementary Metal Oxide Semiconductor (CMOS) image sensor that, for example, is used in a digital camera includes a pixel portion 111. Pixels that detect light from a subject are disposed in a matrix of n×m in the pixel portion 111. For the sake of convenience, only two pixels are shown in FIG. 2.

Each of pixels is composed of transistors 151 to 153, and a photodiode 154. The photodiode 154 outputs a video signal that is obtained by photo-electrically converting the light from the subject. The transistor 152 transfers the video signal from the photodiode 154 to the transistor 153. The transistor 153 amplifies the video signal supplied thereto from the photodiode 154 through the transistor 152, and outputs the resulting video signal to a line 155. The transistor 151 selects the photodiode 154 that is to be driven.

A line 156 connected to a gate of the transistor 151, a line 157 connected to a gate of the transistor 152, and a line 158 connected to a gate of the transistor 153 are all connected to a driver 112 through vias 171, respectively. In addition, the line 155 is connected to a transistor 116 and one input terminal of an AD converter 115 through the via 171. A reference voltage output from a DA converter 114 is supplied to the other input terminal of the AD converter 115. A reference voltage generating portion 113 generates a predetermined reference voltage that is in turn supplied to each of individual portions other than the AD converter 115.

An array controller 117 is connected to the driver 112, the DA converter 114, and the reference voltage generating portion 113 through respective vias 172, and controls operations of the driver 112, the DA converter 114, and the reference voltage generating portion 113. An output of the AD converter 115 is connected to a counter 118 through the via 172. The counter 118 counts a clock that is supplied thereto from a circuit (not shown). The count operation of the counter 118 is controlled in accordance with a digital output signal from the AD converter 115, whereby a count value corresponds to the level of the analog video signal. That is to say, the count value of the counter 118 becomes the digital video signal. The output signal from the counter 118 is supplied to an SRAM 121 functioning as a buffer and is temporarily stored in the SRAM 121. It is noted that when the constitution proposed in the technique of the resent disclosure is used, a DRAM 124 can be substituted for the SRAM 121. As a result, it is possible to reduce a chip size.

The video signal that has been read out from the SRAM 121 serving as a column interface is supplied to a pipeline processing portion 122 and is then subjected to preprocessing. The video signal that has been subjected to the preprocessing in the pipeline processing portion 122 is read out by a Dynamic Random Access Memory (DRAM) controller 123 and is then supplied to the DRAM 124 through the via 172 to be stored in the DRAM 124.

The video signal stored in the DRAM 124 is read out at a predetermined timing by the DRAM controller 123 and is then transferred to the pipeline processing portion 122. The video signal transferred to the pipeline processing portion 122 is temporarily stored in an SRAM 122A built in the pipeline processing portion 122. The video signal temporarily stored in the SRAM 122A is supplied to a data interface 125 and is then output from the data interface 125 to the outside.

An MPU 119 is connected to an OTP 120 through the via 172, and controls operations of the SRAM 121, the pipeline processing portion 122, and the DRAM controller 123 in addition to the array controller 117 in accordance with a program and data that are stored in the OTP 120.

Next, an operation of the semiconductor device 101 will be described. The driver 112 is controlled by the array controller 117 so as to select the pixels belonging to the predetermined line at a predetermined timing. A video signal corresponding to the electric charges that have been accumulated in the photodiode 154 of the pixel thus selected is transferred to the transistor 153 by the transistor 152, and is then amplified by the transistor 153, thereby being read out to the line 155. The video signal thus read out is supplied to one input terminal of the AD converter 115.

The DA converter 114 is controlled by the array controller 117 so as to generate the reference voltage that becomes gradually large at a predetermined timing, and supplies the reference voltage thus generated to the other input terminal of the AD converter 115. The counter 118 starts the operation for counting the clock from the predetermined timing on. When the level of the reference voltage output by the DA converter 114 has become equal to the level of the video signal, the output from the AD converter 115 is inverted. When the output from the AD converter 115 is inverted, the counter 118 latches therein the count value until that time and supplies the count value to the SRAM 121. The count value becomes larger as the level of the video signal becomes large. That is to say, the count value becomes a value that is obtained by converting the analog video signal into the digital video signal.

The video signal that has been temporarily held in the SRAM 121 is subjected to the preprocessing by the pipeline processing portion 122. For example, data on defect pixels is stored in the OTP 120, and the pixel signal from the pixel having a defect is corrected based on the stored defect data. In addition, the video signal is subjected to clump processing.

The video signal that has been subjected to the preprocessing is supplied to the DRAM 124 through the DRAM controller 123 and is then stored in the DRAM 124. The MPU 119 controls the DRAM controller 123 as may be necessary so as to execute predetermined processing for the video signal stored in the DRAM 124.

Figure 3A:
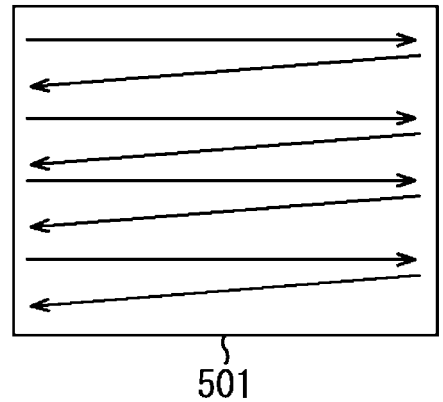
FIGS. 3A, 3B, and 3C are respectively views showing examples of processing for video signal stored in the semiconductor device of the first embodiment.
Figure 3B:
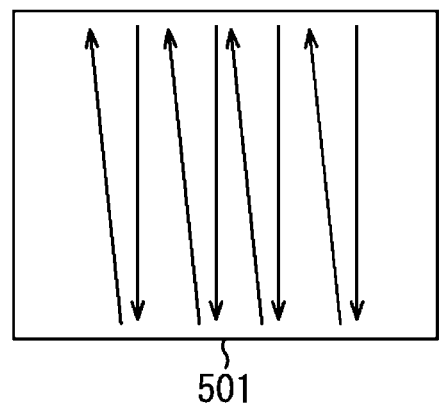
Figure 3C:
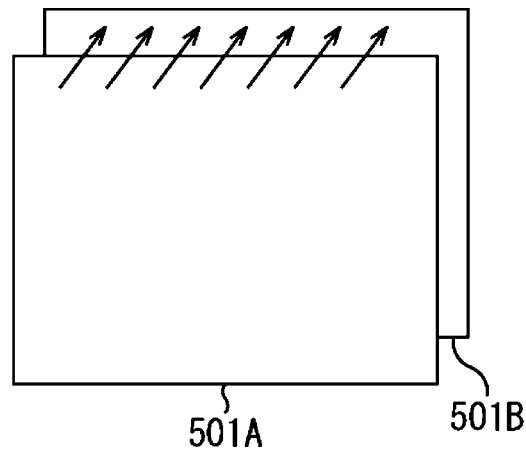

FIGS. 3A, 3B, and 3C are respectively views showing an example of processing for the video signal stored in the DRAM 124. Now, it is supposed that the video signals for one frame are stored in predetermined addresses in the DRAM 124, respectively. As shown in FIG. 3A, the video signals for the frame 501 can be successively read out in a direction from a top left side to a bottom right side. In addition, as shown in FIG. 3B, the video signals within a predetermined area of the frame 501 can also be successively read out in a direction from a top right side to a bottom left side. In addition thereto, as shown in FIG. 3C, differences between the video signals for a frame 501A, and the video signals for a frame 501B before or after the video signals for the frame 501A can be arithmetically operated.

Execution of such various kinds of pieces of processing results in that it is possible to realize functions such as hands movement correction, noise correction, movement detection, Time-of-Flight (ToF) detection, high-speed Autofocus (AF), a high-performance scalar for increasing or decreasing the number of pixels, and digital zoom. The DRAM 124 is built in the semiconductor device 101 in such a manner, whereby the rapid processing becomes possible as compared with the case where the video signal output from the image sensor is processed in an external Digital Signal Processor (DSP).

After the video signals stored in the DRAM 124 have been read out in accordance with the control made by the DRAM controller 123 to be temporarily stored in an SRAM 122A of the pipeline processing portion 122, the video signals concerned are further output to the outside through the data interface 125.

Figure 4A:
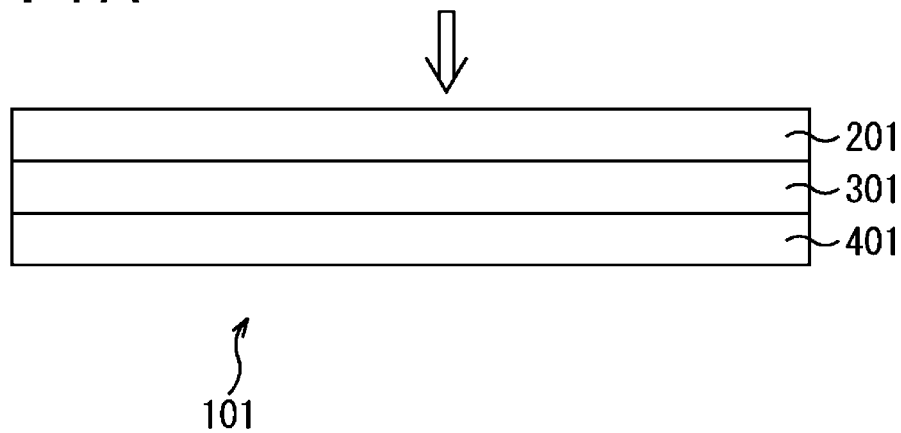
FIGS. 4A and 4B are respectively a cross sectional view and a perspective view showing a lamination structure of the semiconductor device according to the first embodiment of the present disclosure.
Figure 4B:
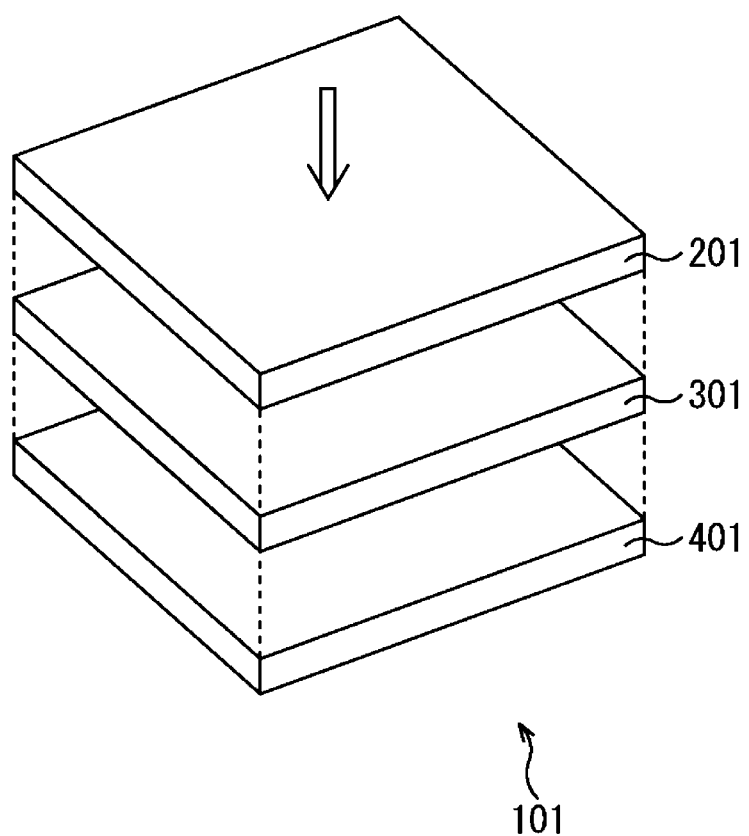

Next, a structure of the semiconductor device 101 will now be described. FIGS. 4A and 4B are respectively a cross sectional view and a perspective view showing a lamination structure of the semiconductor device 101. As shown in FIGS. 4A and 4B, the semiconductor device 101 is composed of three layers: a lowermost substrate 401; a substrate 301 laminated on the lowermost substrate 401; and a substrate 201 laminated on the substrate 301. In a word, the substrate 201, the substrate 301, and the lowermost substrate 401 are laminated in order to be formed in the form of one chip. FIG. 4A shows a state in which the substrate 201, the substrate 301, and the lowermost substrate 401 are laminated in order. Also, FIG. 4B shows a state before the substrate 201, the substrate 301, and the lowermost substrate 401 are laminated in order. In FIGS. 4A and 4B, as indicated by an arrow, light emitted from a subject is made incident from the upper side to the uppermost substrate 201.

Figure 5:
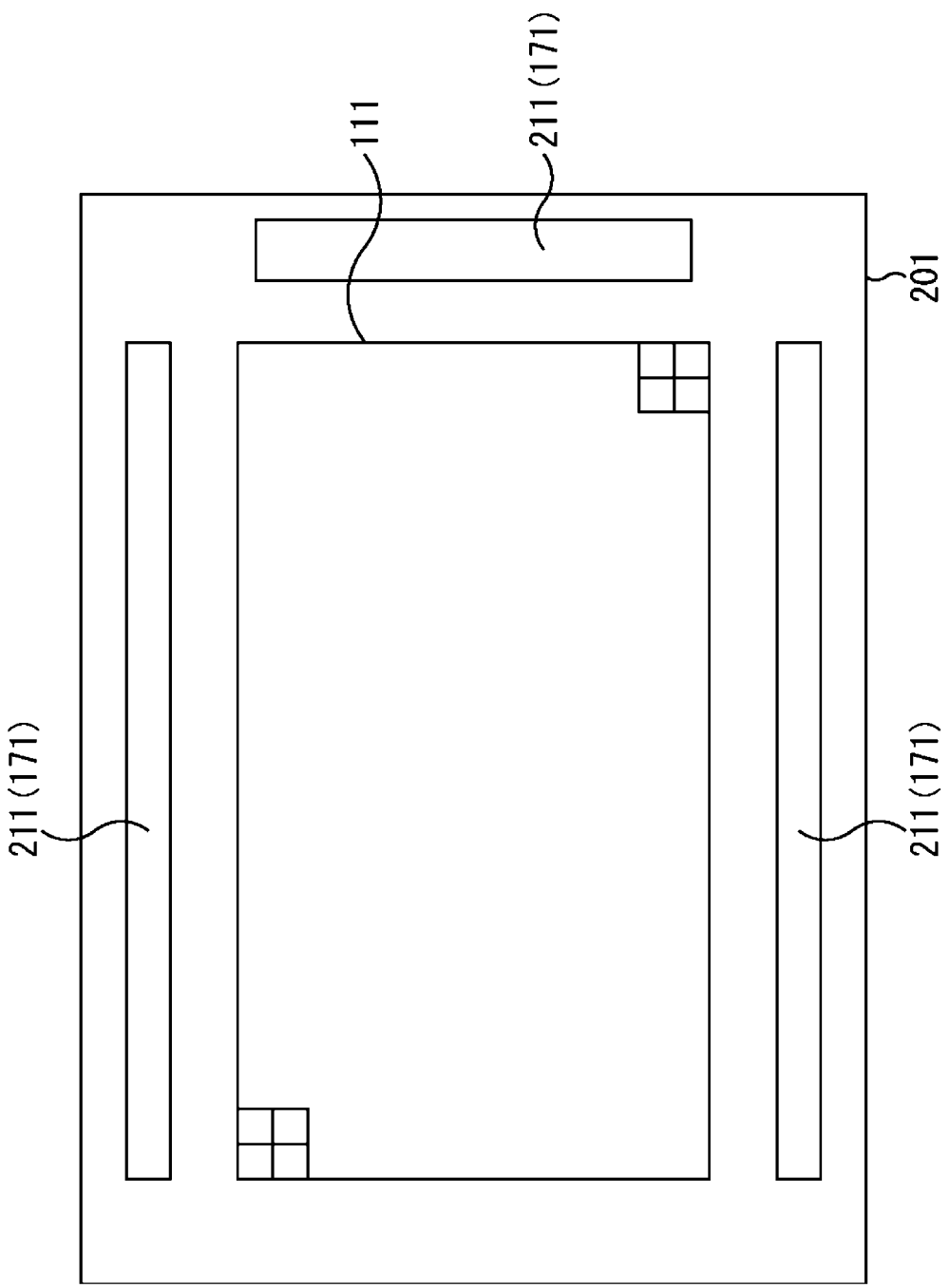
FIG. 5 is a top plan view showing a planar structure of a substrate of pixels in the semiconductor device of the first embodiment.

FIG. 5 is a top plan view showing a planar structure of the substrate 201 for the pixels. As shown in the figure, a pixel portion 111 is formed approximately at the center of the substrate 201. As described above, the pixels are disposed in a matrix of n×m in the pixel portion 111. In the figure, vias 211 are formed on the upper and lower sides, and the right-hand side of the pixel portion 111, respectively. These vias 211 form the vias 171 in FIG. 2, respectively.

Figure 6:
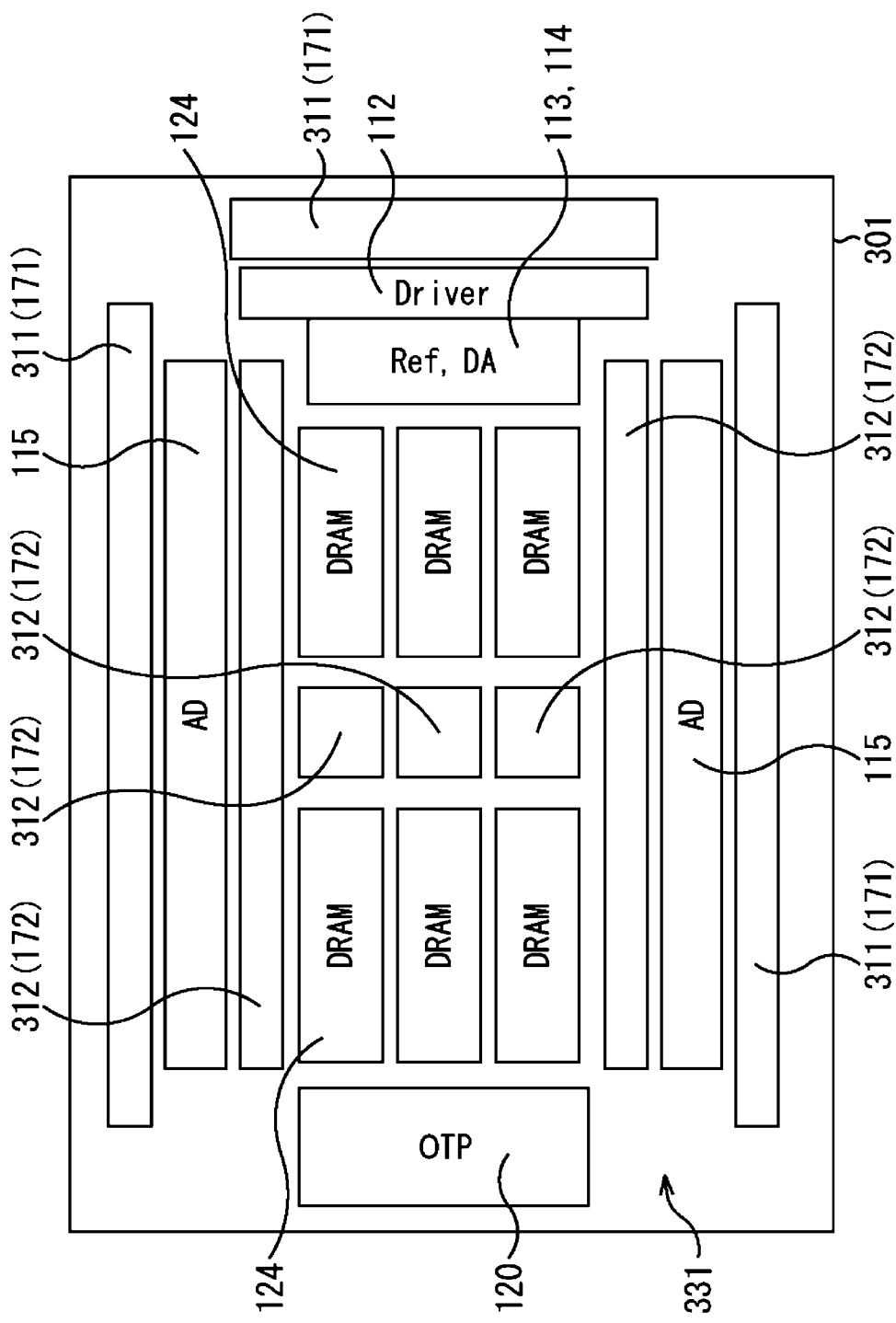
FIG. 6 is a top plan view showing a planar structure of a substrate of an analog portion in the semiconductor device of the first embodiment.

FIG. 6 is a top plan view showing a planar structure of the substrate 301 for the analog portion. The substrate 301 includes a first circuit portion 331 for processing the signals supplied thereto from the pixel portion 111. That is to say, as shown in the figure, three DRAMs 124 are disposed on each of the right-hand side and the left-hand side approximately at the center of the substrate 301, that is, six DRAMs 124 in total are disposed approximately at the center of the substrate 301. The OTP 120 is disposed on the left-hand side of the substrate 301. Both of the reference voltage generating portion 113 and the DA converter 114 are disposed on the right-hand side in the substrate 301. Also, the driver 112 is disposed on the right-hand side of both of the reference voltage generating portion 113 and the DA converter 114 in the substrate 301.

The AD converters 115 each extending in the horizontal direction in the figure are disposed on the upper side and the lower side in the substrate 301, respectively. Vias 312 are formed on the inner side of the AD converters 115. In addition, the three vias 312 are also disposed so as to extend in a longitudinal direction in the figure on the inner sides of the right- and left-hand side DRAMs 124. The three vias 312 form the vias 172 in FIG. 2, respectively.

Vias 311 forming the vias 171 shown in FIG. 2, respectively, are formed on the outsides of the upper and lower AD converter 115, and on the right-hand side of the driver 112 in the substrate 301, respectively. The vias 311 are formed in positions corresponding to the vias 211 of the substrate 201 shown in FIG. 5, respectively. Thus, when the substrate 201 is laminated on the substrate 301, the vias 311 of the substrate 301 are connected to the vias 211 of the substrate 201, thereby forming the vias 171 shown in FIG. 2, respectively.

In such a manner, in the semiconductor 101 of the first embodiment, the analog circuit block and the DRAMs 124 are embedded in the substrate 301. In a word, a first circuit portion 331 of the substrate 301 is composed of the circuit block of the OTP 120, the DRAMs 124, and the like in addition to the analog circuit block of the driver 112, the reference voltage generating portion 113, the DA converter 114, and the AD converter 115.

Figure 7:
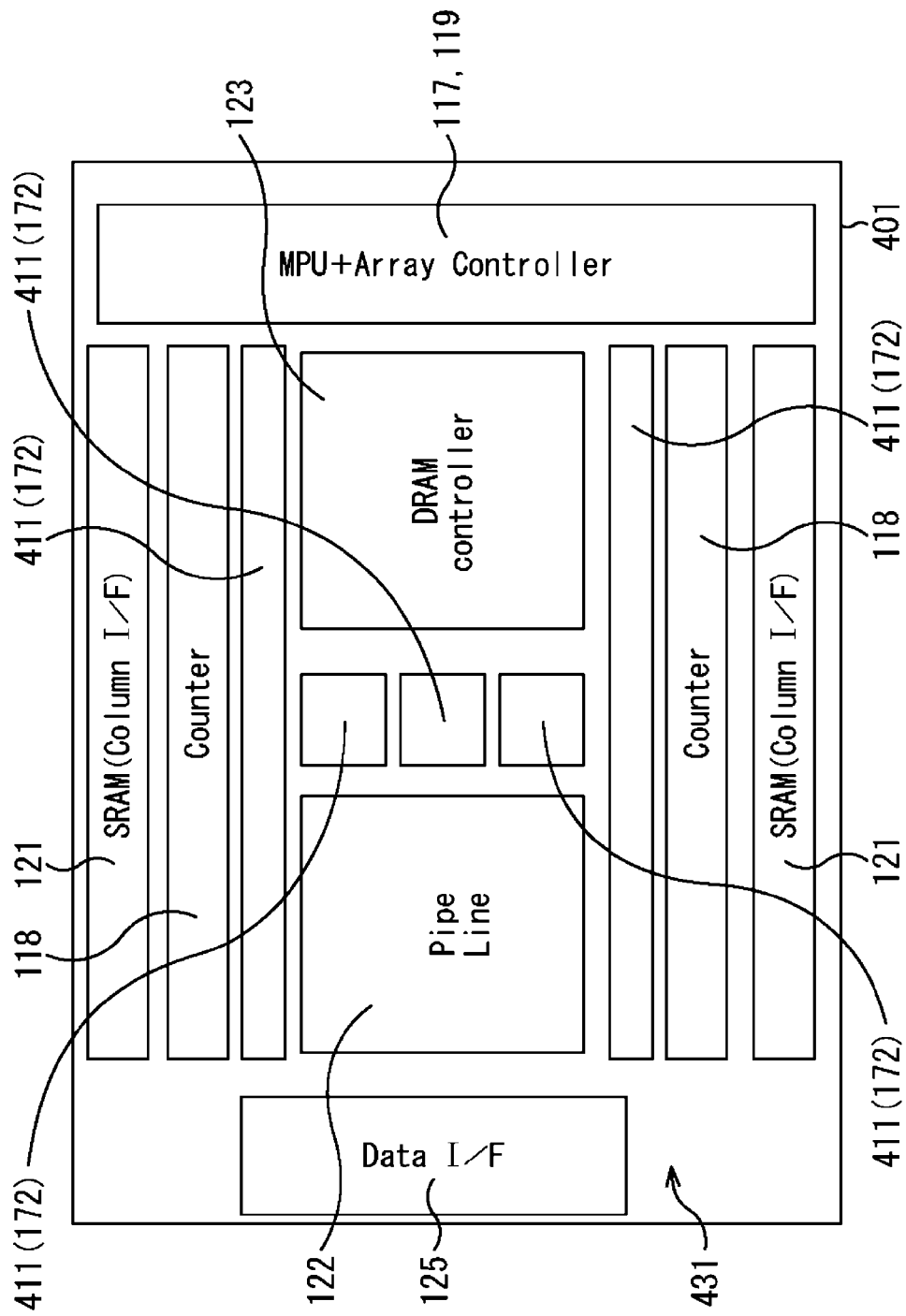
FIG. 7 is a top plan view showing a planar structure of a substrate of a logic portion in the semiconductor device of the first embodiment.

FIG. 7 is a top plan view showing a planar structure of the substrate 401 for the logic portion. The lowermost substrate 401 includes a second circuit portion 431 for processing the signals supplied thereto from the pixel portion 111. That is to say, in the substrate 401, the pipeline processing portion 122 is disposed on the left-hand side approximately at the center. In addition, the data interface 125 is disposed so as to extend in the longitudinal direction in the figure on the left-hand side of the pipeline processing portion 122. The DRAM controller 123 is disposed on the right-hand side approximately at the center of the lowermost substrate 401. Also, both of the MPU 119 and the array controller 117 are disposed so as to extend in the longitudinal direction in the figure on the right-hand side of the DRAM controller 123.

The SRAMs 121 each serving as the column interface are disposed so as to extend in the horizontal direction in the figure on the upper and lower sides of the substrate 401, respectively. Also, the counters 118 are disposed so as to extend in the horizontal direction in the figure on the inner sides of the SRAMs 121.

Vias 411 are disposed so as to extend in the horizontal direction in the figure on the inner sides of the counters 118, respectively. In addition, three vias 411 are disposed between the pipeline processing portion 122 and the DRAM controller 123 so as to extend in the longitudinal direction in the figure.

The vias 411 of the lowermost substrate 401 are formed in positions corresponding to the vias 312 of the substrate 301 shown in FIG. 6, respectively. Thus, when the substrate 301 is laminated on the lowermost substrate 401, the vias 411 of the substrate 401 are connected to the vias 311 of the substrate 301, thereby forming the vias 172 shown in FIG. 2, respectively.

In such a manner, a second circuit portion 431 of the lowermost substrate 401 is composed of the circuit block of the array controller 117, the counters 118, the MPU 119, the SRAMs 121, the pipeline processing portion 122, the DRAM controller 123, the data interface 125, and the like. It is noted that although not illustrated in FIG. 8, as shown in FIG. 7, both of the array controller 117 and the DRAM controller 123 are also included in the second circuit portion 431 of the lowermost substrate 401.

Figure 8:
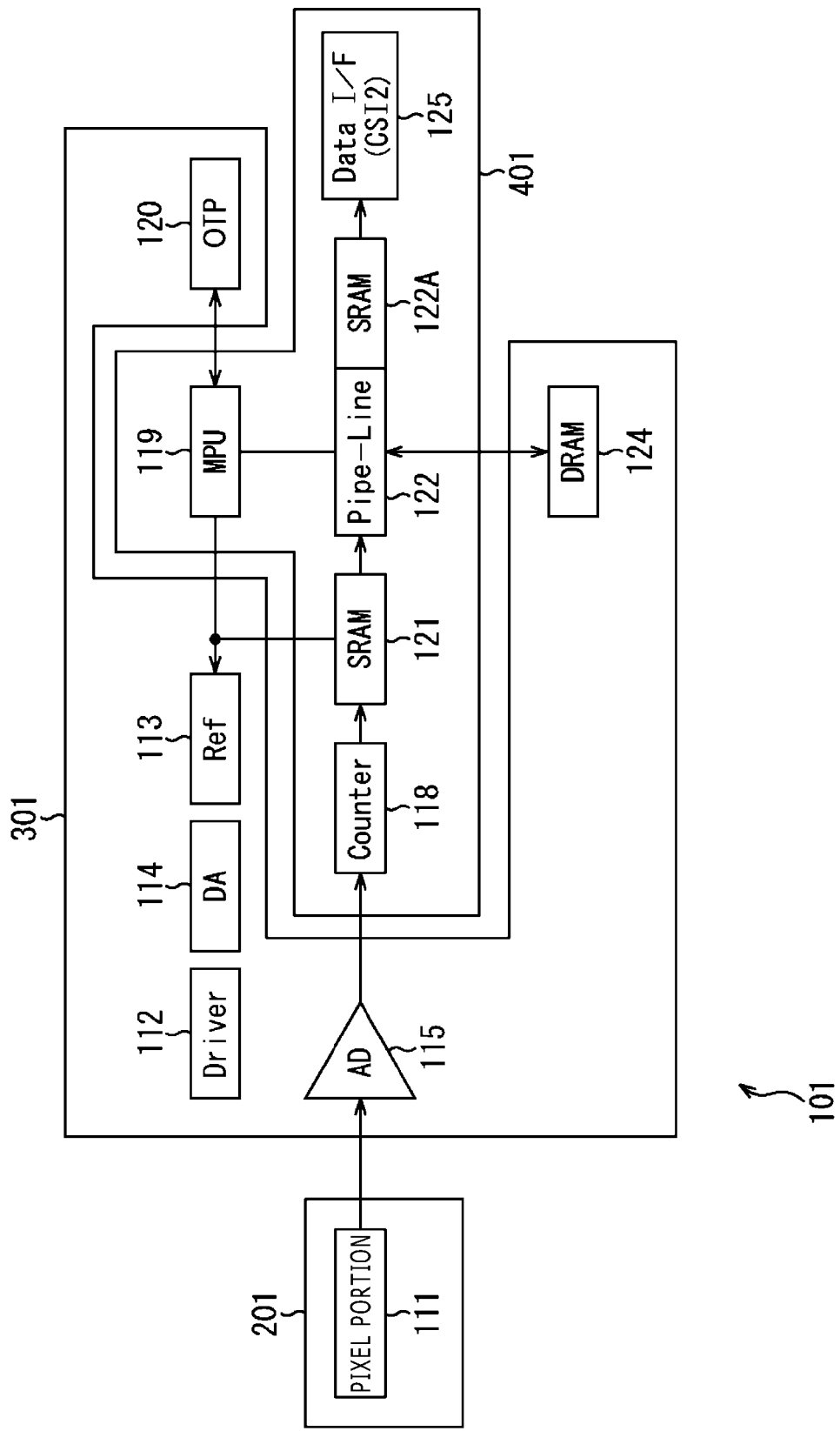
FIG. 8 is a block diagram showing a relationship of connection between blocks in the substrate in the semiconductor device of the first embodiment.

FIG. 8 is a block diagram showing a relationship of connection among the blocks of the substrates. The output from the pixel portion 111 of the substrate 201 is supplied to the AD converter 115 of the substrate 301. The output from the AD converter 115 is supplied to the counter 118 of the lowermost substrate 401, and is used to control the counting operation of the counter 118. After the count value of the counter 118 has been subjected to the predetermined pre-processing by the pipeline processing portion 122 of the lowermost substrate 401 through the SRAM 121 of the lowermost substrate 401, the resulting count value is supplied to the DRAM 124 of the substrate 301 to be stored in the DRAM 124. The operation of the pipeline processing portion 122 is controlled by the MPU 119 on the lowermost substrate 401.

Both of the program and the data in the MPU 119 are stored in the OTP 120 on the substrate 301. The driver 112, the DA converter 114, and the reference voltage generating portion 113 are also disposed on the substrate 301.

The video signals stored in the DRAM 124 of the substrate 301 are supplied to the data interface 125 of the lowermost substrate 401 through the SRAM 122A of the pipeline processing portion 122 of the substrate 401 and are further output from the data interface 125 to the outside. The data interface 125, for example, can comply with the standards of a Camera Serial Interface 2 (CSI 2).

The provision of the three substrates 201, 301, and 401 results in that the logic circuit in which an amount of heat generation is more can be disposed on the lowermost substrate 401, and the circuit block in which an amount of heat generation is less can be disposed on the substrate 301. In a word, in addition to the analog circuit block of the driver 112, the reference voltage generating circuit 113, the DA converter 114, and the AD converter 115, the circuit block, in which an amount of heat generation is less, of the OTP 120, the DRAM 124, and the like can be disposed on the substrate 301. As a result, it becomes possible to suppress an amount of generation of a noise in the pixel portion 111 of the substrate 201. In addition, a substrate having a high-integration level can be used as the lowermost substrate 401.

In a word, the substrate 301 is disposed between the lowermost substrate 401 and the substrate 201. As a result, the substrate 201 having the pixel portion 111 can be pushed away from the lowermost substrate 401. An amount of heat generation of a circuit block becomes more as an operation frequency becomes higher. Then, the circuit block of the logic in which an amount of heat generation is relatively more is disposed on the lowermost substrate 401. In other words, the analog circuit block that does not generate the heat or in which an amount of heat generation is comparatively less even in the case of the heat generation is disposed on the substrate 301. As a result, it is possible to prevent noise and heat that are generated in the lowermost substrate 401 from influencing the pixel portion 111 of the substrate 201 in a manner that would deteriorate the video signal. In addition, since the lowermost substrate 401 is the outermost one of the substrates, the lowermost substrate 401 easily discharges the heat to the outside making it is possible to suppress an increase in a temperature of the semiconductor device 101.

An amount of heat generation of the substrate 301 is made less than that of the lowermost substrate 401 (in other words, an amount of heat generation of the lowermost substrate 401 is made more than that of the substrate 301), thereby making it possible to suppress the bad influence exerted on the pixel portion 111 by the heat generation. In a word, all of the circuit blocks are decentrally disposed in the substrate 301 and the lowermost substrate 401 in such a way that an amount of heat generation of the first circuit portion 331 of the substrate 301 becomes less than that of the second circuit portion 431 of the lowermost substrate 401.

Or, for example, even when of the circuit blocks to be disposed, the circuit block in which an amount of heat generation is most is disposed in the lowermost substrate 401 instead of being disposed on the substrate 301, it is also possible to realize the same effect.

It is noted that an amount of heat generation for the comparison can be adopted either as an amount of heat generation when the semiconductor device 101 is used only for a given time by utilizing a method with which the heat is easiest to generate, or as an amount of heat generation when the semiconductor device 101 is used only for a standard time by utilizing a standard method. When the severest condition is set, it is possible to adopt the former amount of heat generation.

From the above description, the high-quality video signal can be acquired with the semiconductor device 101.

The semiconductor device 101 described above, for example, can be applied to an image sensor of an image pickup system such as a digital camera. FIG. 9 is a block diagram showing a configuration of a sensing system according to a second embodiment of the present disclosure. In the case of the second embodiment shown in FIG. 9, the sensing system is applied to an image pickup system. For the sake of convenience of a description, a configuration of an image pickup system 601 is simplified. The image pickup system 601 includes a lens 611, an image sensor 101A composed of the semiconductor device 101 of the first embodiment described above, a signal processing portion 612, a memory 613, and a display portion 614.

It is noted that any of the semiconductor devices according to the first, and third to eighth embodiments of the present disclosure, which will be described in order, can also be applied to the image pickup system 601.

Light emitted from a subject is converged to be made incident to the image sensor 101A. The image sensor 101A outputs a video signal corresponding to the subject based on the light emitted from the subject. The signal processing portion 612 processes and modulates the video signal supplied thereto from the image sensor 101A to generate a recording signal, and supplies the resulting recording signal to the memory 613 to be stored in the memory 613. The memory 613 is composed of a hard disc, a solid-state memory or the like. The signal processing portion 612 outputs the video signal to the outside as may be necessary.

The signal processing portion 612 reads out the video signal stored in the memory 613 at a predetermined timing, demodulates the video signal thus read out, and supplies the resulting video signal to the display portion 614. As a result, an image of the subject is displayed on the display portion 614.

As described above, it is suppressed that the image sensor 101A suffers the bad influence by the heat. Therefore, it is possible to obtain the high-quality image with the image sensor 101A.

Figure 10:
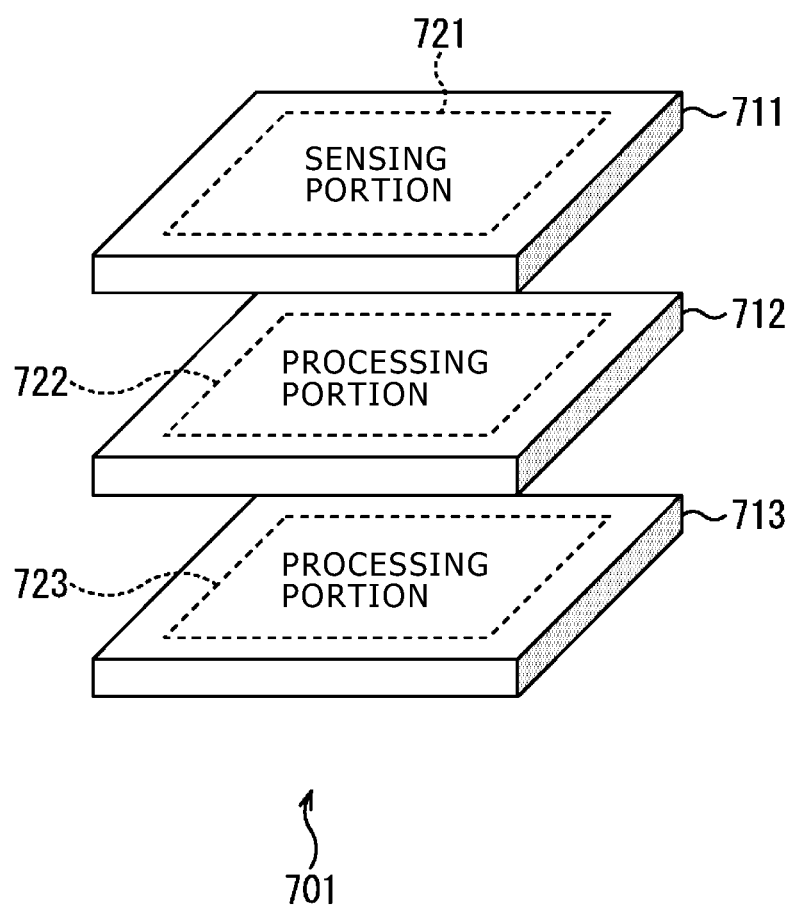
FIG. 10 is a view showing a structure of a semiconductor device according to a third embodiment of the present disclosure.

The present disclosure can be applied to not only the image pickup system that outputs the image information, but also various kinds of sensing systems for which a high-definition signal having a large capacity about sound information, position information, speed information, and the like is required to output. FIG. 10 is a schematic view showing a structure of a semiconductor device 701 according to a third embodiment of the present disclosure.

The semiconductor device 701 shown in FIG. 10 is composed of a sensing portion 721, a processing portion 722, and a processing portion 723. The sensing portion 721 is formed on a substrate 711, the processing portion 722 is formed on a substrate 712, and the processing portion 723 is formed on a substrate 713. The substrate 712 is laminated on the substrate 713, and the substrate 711 is laminated on the substrate 712. The sensing portion 721 formed on the substrate 711 detects sound information, position information, speed information, and the like. The processing portion 722 formed on the substrate 712 processes data detected by the sensing portion 721. The processing portion 723 formed on the substrate 713 processes the data (including the case where the data is processed by the processing portion 722 of the substrate 712) detected by the sensing portion 721.

The sensing portion 721 on the substrate 711, the processing portion 722 on the substrate 712, and the processing portion 723 on the substrate 713 in the semiconductor device 701 shown in FIG. 10 correspond to the pixel portion 111 on the substrate 201, the first circuit portion 331 on the substrate 301, and the second circuit portion 431 on the substrate 401 in the semiconductor device 101 shown in FIGS. 4A and 4B, respectively.

In the case as well of the semiconductor device 701 of the third embodiment, the processing portions 722 and 723 are decentrally disposed on the substrate 712 and the substrate 713 in such a way that an amount of heat generation of the substrate 712 contacting the substrate 711 becomes less than that of the substrate 713. Three substrates 711, 712, and 713 are formed in the form of one chip so as to have the lamination structure. As a result, it is possible to obtain the high-quality output signal with the semiconductor device 701 of the third embodiment.

It is noted that even in the case as well where the lamination structure having four layers or more is adopted, a circuit block in which an amount of heat generation is most is disposed on a lowermost substrate (a substrate that is laminated farthest from the substrate 711 having the sensing portion 721 formed thereon).

Figure 11:
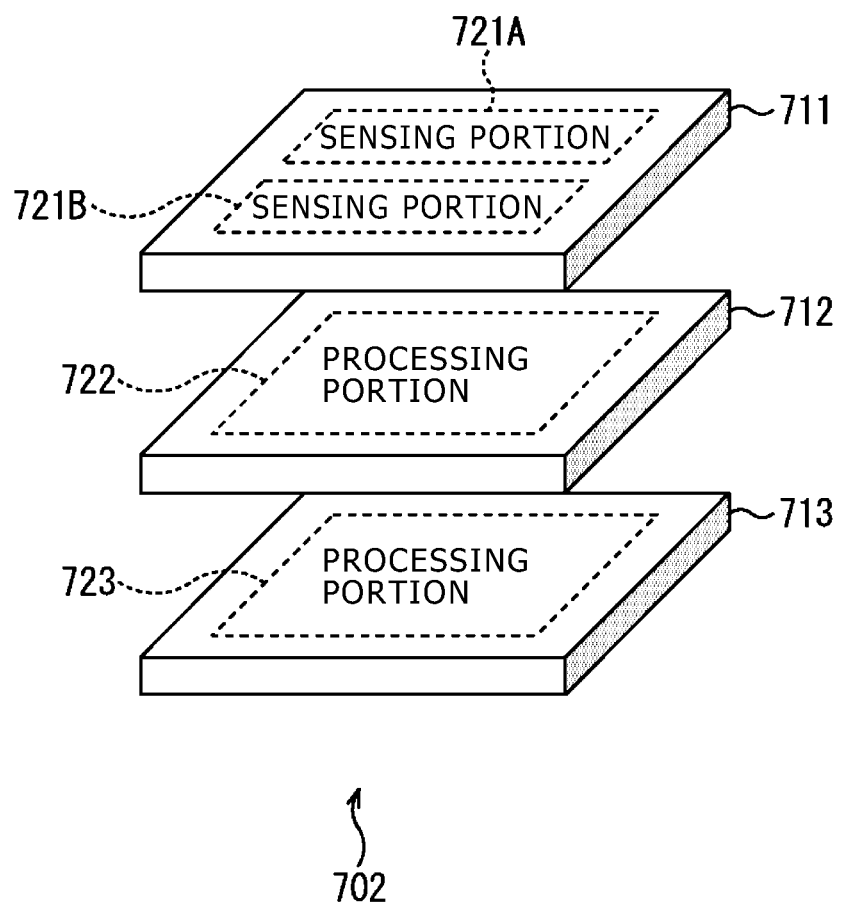
FIG. 11 is a view showing a structure of a semiconductor device according to a fourth embodiment of the present disclosure.

FIG. 11 is a schematic view showing a structure of a semiconductor device 702 according to a fourth embodiment of the present disclosure. Hereinafter, components similar to those previously described with reference to FIG. 10 are denoted by the same reference numerals and the description thereof will be omitted. In the semiconductor device 702 of the fourth embodiment, plural sensing portions are formed on the substrate 711. In the case of the fourth embodiment shown in FIG. 11, two sensing portions 721A and 721B are formed on the substrate 711. The two sensing portions 721A and 721B detect either the same kind of pieces of information or different pieces of information. The processing portions 722 and 723 that are formed on the substrates 712 and 713, respectively, process either one of or both of the output signals from the sensing portions 721A and 721B. Other structures of the semiconductor device 702 are the same as those shown in FIG. 10.

Figure 12:
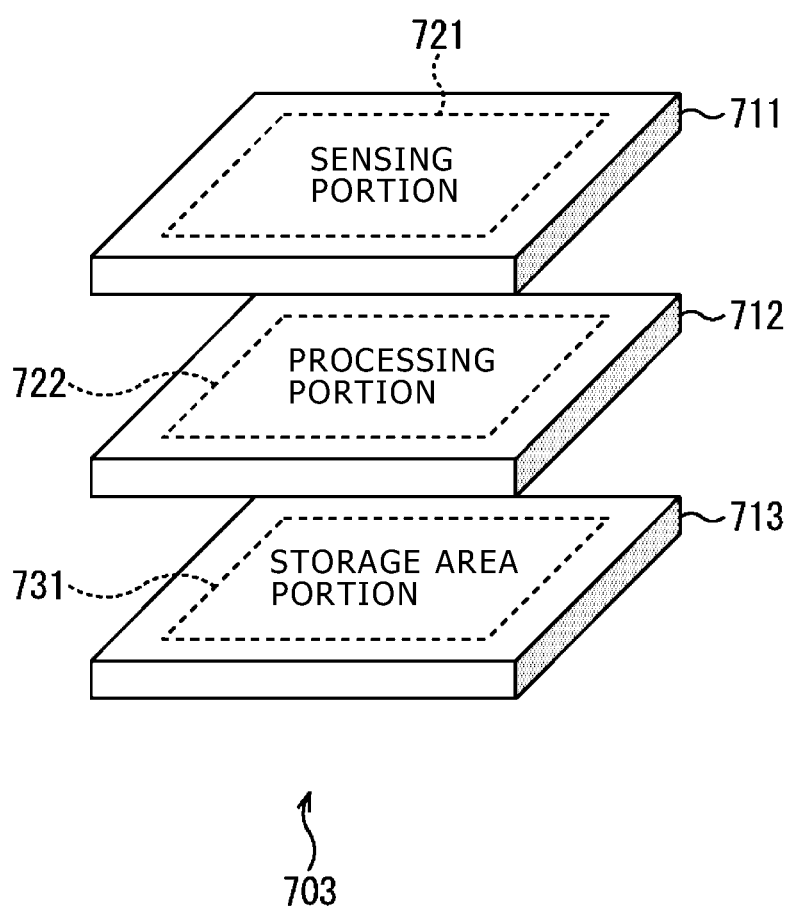
FIG. 12 is a view showing a structure of a semiconductor device according to a fifth embodiment of the present disclosure.

FIG. 12 is a schematic view showing a structure of a semiconductor device 703 according to a fifth embodiment of the present disclosure. In the semiconductor device 703 of the fifth embodiment, a storage area portion 731 is formed as the processing portion 723 of the substrate 713 shown in FIG. 10. Of course, not in the entire processing portion 723, but in a part of the processing portion 723, the storage area portion 731 may also be formed. The storage area portion 731 of the substrate 713 stores therein the data output from the sensing portion 721 of the substrate 711 (including the case where the data is processed in the processing portion 722 of the substrate 712). Other structures of the semiconductor device 703 are the same as those shown in FIG. 10 or FIG. 11.

It is noted that the processing portion 723 can also be formed on the lowermost substrate 713, and the storage area portion 731 can also be formed on the intermediate substrate 712.

Figure 13:
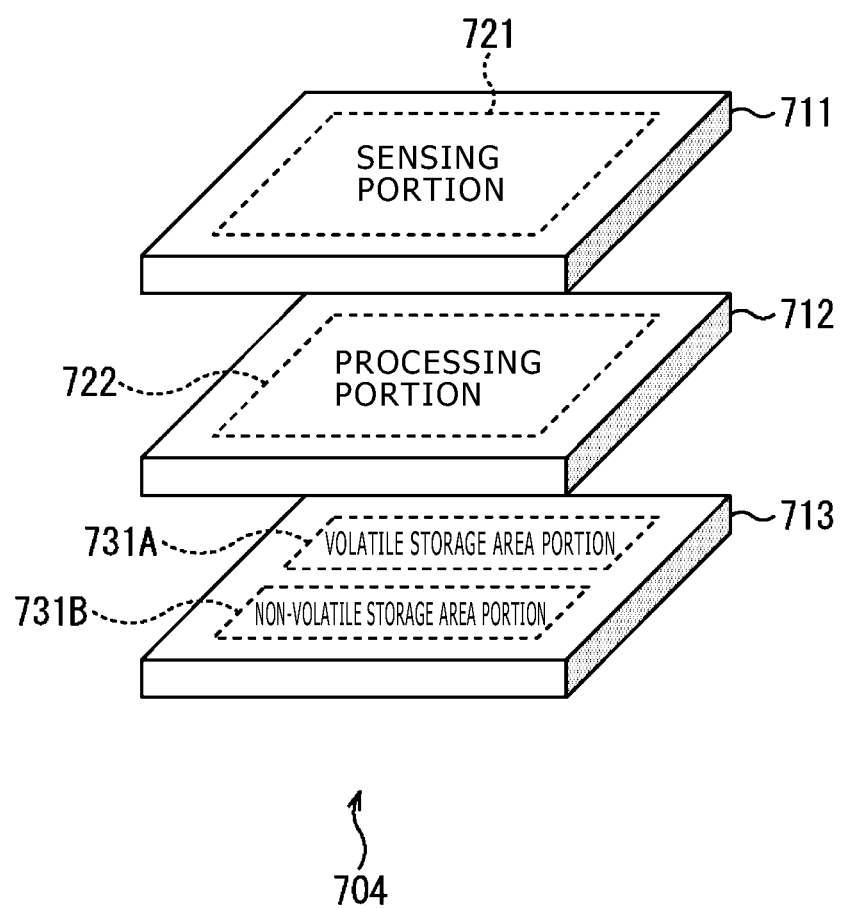
FIG. 13 is a view showing a structure of a semiconductor device according to a sixth embodiment of the present disclosure.

FIG. 13 is a schematic view showing a structure of a semiconductor device 704 according to a sixth embodiment of the present disclosure. In the semiconductor device 704 of the sixth embodiment, both of a volatile storage area portion 731A and a non-volatile storage area portion 731B are formed as the storage area portion 731 on the substrate 713. Information that should be erased in a phase of an OFF state of a power source is stored in the volatile storage area portion 731A. On the other hand, information that should not be erased in the phase as well of the OFF state of the power source is stored in the non-volatile storage area portion 731B. Other structures are the same as those in the case shown in FIG. 12.

Figure 14:
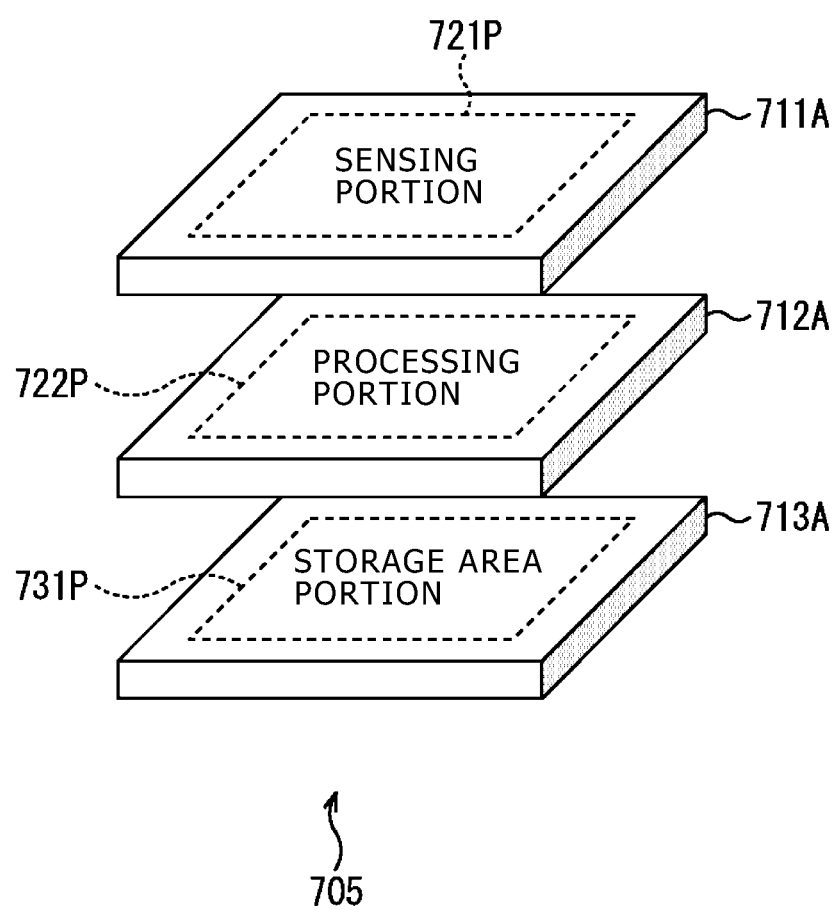
FIG. 14 is a view showing a structure of a semiconductor device according to a seventh embodiment of the present disclosure.

FIG. 14 is a schematic view showing a structure of a semiconductor device 705 according to a seventh embodiment of the present disclosure. The semiconductor device 705 of the seventh embodiment is basically identical in structure to the semiconductor device 703 shown in FIG. 12. However, in the semiconductor device 705, a sensing portion 721P of a substrate 711A is manufactured in a manufacturing process A, a processing portion 722P of a substrate 712A is manufactured in a manufacturing process B, and a storage area portion 731P of a substrate 713A is manufactured in a manufacturing process C.

When the semiconductor device 705 is formed in the form of the multi-layer structure, the individual layers are manufactured in the optimal manufacturing processes, respectively, whereby it is possible to reduce the power consumption.

Figure 15:
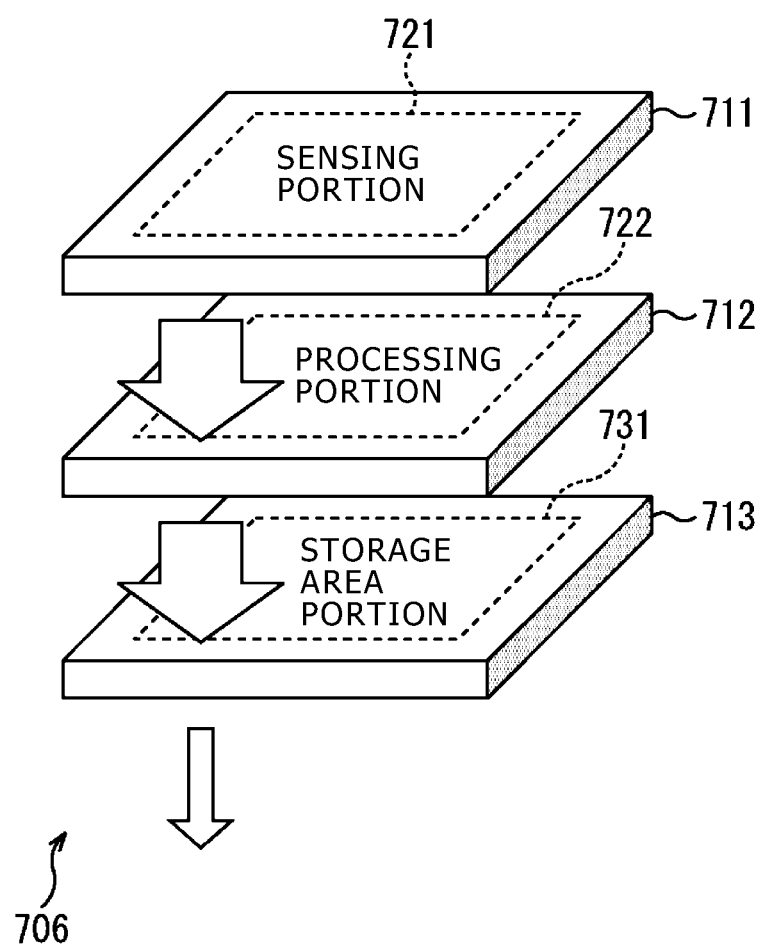
FIG. 15 is a view explaining processing for a semiconductor device according to an eighth embodiment of the present disclosure.

FIG. 15 is a schematic view explaining processing for a semiconductor device 706 according to an eighth embodiment of the present disclosure. In the semiconductor device 706 shown in FIG. 15, data detected by the sensing portion 721 of the substrate 711 is processed by the processing portion 722 of the substrate 712 and is then stored in the storage area portion 731 of the substrate 713. Also, of the predetermined pieces of data stored in the storage area portion 731 of the substrate 713, only a part of thereof is output to the outside. That is to say, only the part of the predetermined pieces of data detected by the sensing portion 721 is output to the outside.

Providing the storage area portion 731 in such a manner results in that it is possible to store the information in a time direction and thus it is possible to embody the various kinds of signal forms. In addition, since the data detected can be stored in the storage area portion 731, a part of the predetermined pieces of data detected can be output to the output stage. In a word, it is possible to contribute to the relaxation of the interface speed for input/output. In addition, along with the relaxation of the interface speed for input/output, it is possible to suppress the radiation of the electromagnetic wave.

Figure 16:
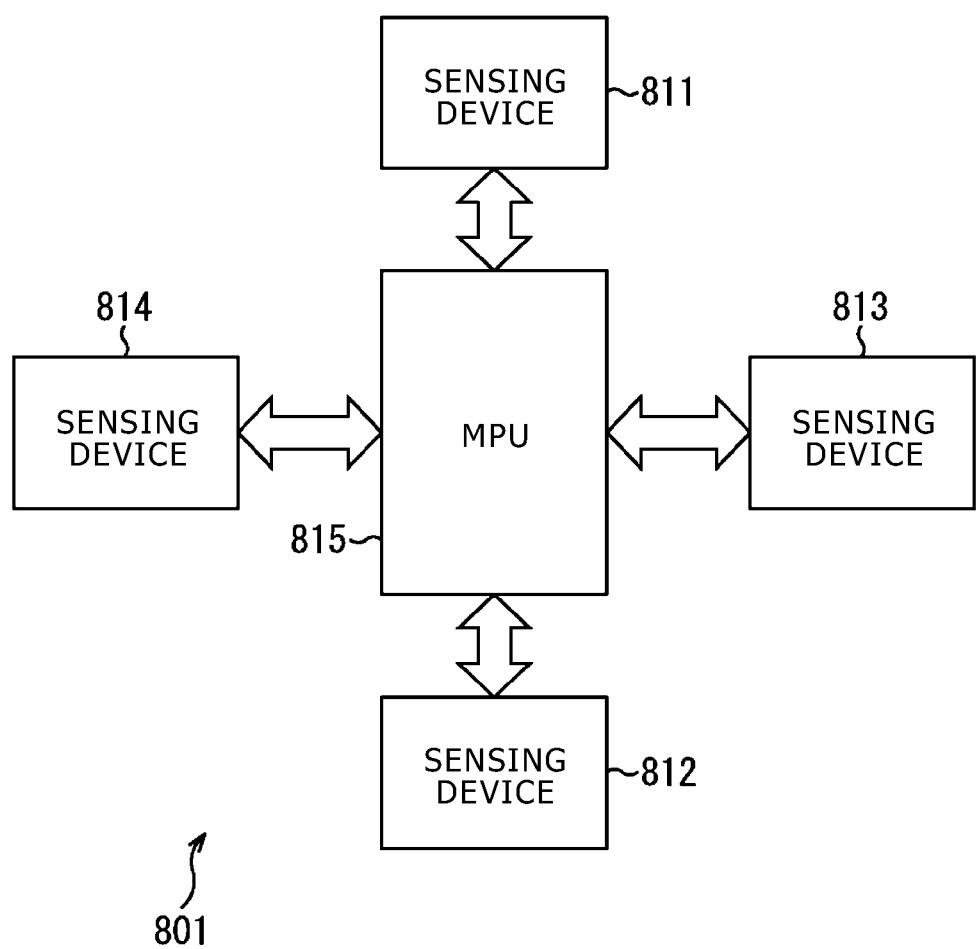
FIG. 16 is a block diagram showing a configuration of a sensing system according to a ninth embodiment of the present disclosure.

FIG. 16 is a block diagram showing a configuration of a sensing system 801 according to a ninth embodiment of the present disclosure. The sensing system 801 of the ninth embodiment shown in FIG. 16 is composed of sensing devices 811 to 814, and an MPU 815. The sensing devices 811 to 814 are composed of the semiconductor device 101 shown in FIGS. 4A and 4B, the semiconductor devices 701 to 706 shown in FIGS. 10 to 15, respectively, and the like.

The sensing devices 811 to 814, for example, individually detect data on various kinds of pieces of information, corresponding to the function of the sensing system 801, such as the sound information and others in addition to the image information, the auto-focus information, the position information, and the speed information. The MPU 815 processes the predetermined pieces of data detected by the sensing devices 811 to 814.

The sensing devices 811 to 814 can output the predetermined pieces of data on the various kinds of pieces of physical information that were detected by the sensing devices 811 to 814, respectively, after up to the signal processing has been executed. Therefore, it is possible to standardize the standards with which the signals having the various kinds of forms (such as the image information, the sound information, the position information, and the speed information) comply. In a word, the signals complying with the predetermined standards previously determined can be finally output from the sensing devices 811 to 814, and the like irrespective of the forms of the signals output from the sensing portions 721 that the sensing devices 811 to 814, and the like have, respectively. As a result, for example, it becomes possible to adopt the sensing portion 721 manufactured by an arbitrary maker. Thus, the degree of freedom is increased.

It is also noted that the embodiments of the present disclosure are by no means limited to the embodiments described above, and thus various changes can be made without departing from the subject matter of the present disclosure.

For example, the concrete circuit blocks disposed on the respective substrates are by no means limited to those described in the embodiments described above.

What is claimed is:
1. A semiconductor device comprising:
a sensing device configured to convert light into a signal from a first substrate, the first substrate includes the sensing device;
a second substrate configured to output an amount of heat when converting the signal from the first substrate into data, the amount of heat is less than a different amount of heat; and
a third substrate configured to output the different amount of heat when processing either the signal from the first substrate or the data from the second substrate, the second substrate is between the first substrate and the third substrate,
wherein a storage area portion in the third substrate is configured to store the signal from the first substrate or the data from the second substrate, and
wherein the sensing device includes a pixel portion that is configured to convert the light into an output, the second substrate includes an analog to digital converter that is configured to convert the output into the signal from the first substrate.

2. The semiconductor device according to claim 1, wherein the second substrate includes dynamic random access memory.

3. The semiconductor device according to claim 1, wherein the third substrate includes static random access memory and dynamic random access memory.

4. The semiconductor device according to claim 1, further comprising:
a different sensing device configured to convert light into another signal, a first substrate includes the different sensing device.

5. The semiconductor device according to claim 1, wherein the data from the second substrate is a digital signal.

6. The semiconductor device according to claim 5, wherein the signal from the first substrate is an analog signal.

7. The semiconductor device according to claim 1, wherein the storage area portion in the third substrate a volatile storage area and a non-volatile storage area.

8. The semiconductor device according to claim 1, wherein the second substrate includes circuitry from the group consisting of an analog circuit, a circuit block of a driver, a reference voltage generating portion, a digital to analog converter, an analog to digital converter, dynamic random access memory, and one-time programmable read only memory.

9. The semiconductor device according to claim 1, wherein the third substrate includes circuitry from the group consisting of a logic circuit, circuit block of a pipeline processing portion, a counter, a static random access memory, a micro processing unit, an array controller, and a dynamic random access memory controller.

10. The semiconductor device according to claim 1, wherein the third substrate is configured to output the data from the second substrate.

11. The semiconductor device according to claim 1, wherein the semiconductor device is an image sensor.

12. A sensing system comprising:
a sensing device configured to convert light into a signal from a first substrate, the first substrate includes the sensing device;
a second substrate configured to output an amount of heat when converting the signal from the first substrate into data, the amount of heat is less than a different amount of heat; and
a third substrate configured to output the different amount of heat when processing either the signal from the first substrate or the data from the second substrate, the second substrate is between the first substrate and the third substrate; and a micro processing unit that processes the signal from the first substrate and a signal from another sensing device,
wherein the sensing device includes a pixel portion that is configured to convert the light into an output, the second substrate includes an analog to digital converter that is configured to convert the output into the signal from the first substrate.

\* \* \* \* \*